United States Patent [19]

Mussmann

[11] Patent Number: 4,554,530
[45] Date of Patent: Nov. 19, 1985

[54] METHOD AND APPARATUS FOR SCANNING A MATRIX OF SWITCHABLE ELEMENTS

[75] Inventor: Richard F. Mussmann, Indianapolis, Ind.

[73] Assignee: AT&T Bell Laboratories, Murray Hill, N.J.

[21] Appl. No.: 333,066

[22] Filed: Dec. 21, 1981

[51] Int. Cl.$^4$ .............................................. G06F 3/02
[52] U.S. Cl. .............................. 340/365 S; 340/365 R; 364/900
[58] Field of Search ............ 340/365 E, 365 S, 365 R; 364/709

[56] References Cited

U.S. PATENT DOCUMENTS

| | | | |
|---|---|---|---|
| 3,979,730 | 9/1976 | Bennett et al. | 364/200 |
| 4,106,011 | 8/1978 | Melanson et al. | 340/365 |
| 4,145,687 | 3/1979 | Masuda | 340/365 |
| 4,222,038 | 9/1980 | Magerl | 340/365 |
| 4,231,016 | 10/1980 | Ueda | 340/365 E |
| 4,241,333 | 12/1980 | Giebler et al. | 340/365 |
| 4,470,037 | 9/1984 | Takahashi | 364/709 |

Primary Examiner—James D. Thomas
Assistant Examiner—David L. Clark
Attorney, Agent, or Firm—Harry L. Newman

[57] ABSTRACT

A keyboard scan circuit in accordance with the present invention comprises a microprocessor (301) for scanning rows and columns of a matrix (300) of switchable elements. The scanning capacity of the microprocessor is increased in terms of the quantity of switchable elements the microprocessor may scan without increasing the number of ports or leads employed for scanning and without the use of a peripheral interface adapter circuit. In one embodiment of the present invention, one output port (307, 307A) of microprocessor (301) is connected in parallel to a central processor (308) and to the scanned matrix (300). A logic gate (309) is connected in parallel to at least two output leads (302A) of another port (302) of microprocessor (301). Logic gate (309) strobes the central processor (308) to read a code identifying a switched element at the parallel-connected output port (307, 307A). The central processor (308) otherwise ignores the presence of scanning signals at the parallel-connected output port (307, 307A). In an alternative embodiment, serial transmission of the code is accomplished by transmitting the code through the logic gate (309).

4 Claims, 7 Drawing Figures

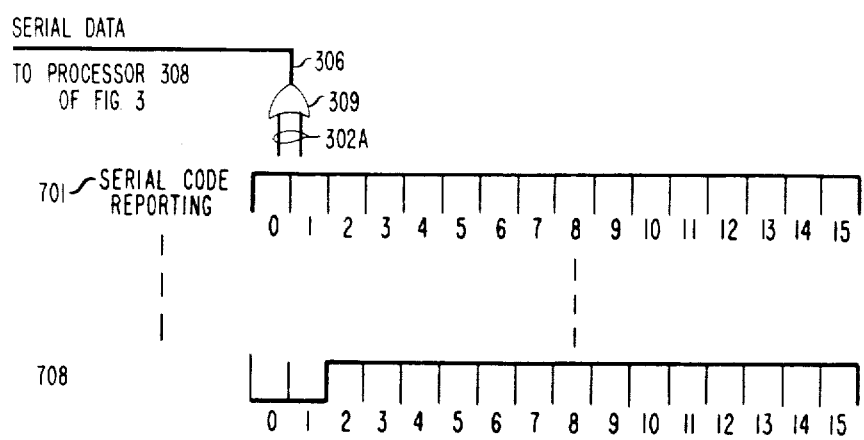

METHOD AND APPARATUS FOR SCANNING A MATRIX OF SWITCHABLE ELEMENTS

BACKGROUND OF THE INVENTION

1. Technical Field

This invention relates to crosspoint matrices and, more particularly, to a method and apparatus for scanning a matrix of switchable elements such as a keyboard.

2. Description of the Prior Art

Methods and apparatus for scanning a matrix of switchable elements, such as a keyboard, are generally known in the developing art of business machine and data terminal manufacture. Thus it is known in the art to employ a special purpose microprocessor to scan a keyboard and to provide signals indicative of the particular keys that are operated. However, such a special purpose microprocessor is limited in the number of leads on which data can be input and output. As a result, the size of the keyboard that the microprocessor is capable of scanning is correspondingly limited.

FIG. 1 shows one common arrangement that uses a special purpose microprocessor for scanning a keyboard. Microprocessor 101 provides a scanning port 102 comprising eight leads for scanning eight rows of an eight-by-eight row and columnar matrix 100 and ten return leads for retrieving data identifying a switched element. In particular, a data retrieval port 103 comprising eight leads provides information as to the column number of the switched element, and shift and control leads 104 and 105 provide information as to the shift or control status of the switched element. A separate output port 107, comprising eight leads, and a strobe lead 106 indicate to the processor 108 the particular code of the switched element. The keyboard scanning capacity of such special purpose microprocessors is limited to sixty-four switchable elements while twenty-seven input and output leads are employed for scanning and code reporting.

The operation of microprocessor 101 comprises the steps of scanning the matrix 100 of rows and columns one row at a time by changing the state of one scanning lead at a time. If one of the switchable elements has switched in a particular scanned row, a connection is completed to a columnar lead and a corresponding signal may be read on the data retrieval lead of port 103 associated with the columnar location of the switched element. The last steps are to perform a translation of the location of the switched element to a particular ASCII code and to report the code of the element to the processor 108 over port 107, the processor being strobed to read port 107 by a strobe signal on strobe lead 106. Because a close relationship exists between the scanning method and apparatus of FIG. 1, it is desirable that a solution to the problem of increasing scanning capacity be compatible with existing scanning methods.

At present, the only known way of increasing the scanning capacity beyond the capacity of a special purpose microprocessor is by the addition of a peripheral interface adapter (PIA) or similar device. Referring to FIG. 2, one arrangement employing a peripheral interface adapter 210 is shown. Responsive to signals on control lead or leads 213 and scanning port 202, two scanning ports 211 and 212 are provided for scanning matrix 200 of increased size. As in FIG. 1, data retrieval port 203 and control and shift leads 204 and 205 report data identifying the switched element and its status respectively to microprocessor 201. Processor 208, as in FIG. 1, is strobed when a code for the switched element may be read on output port 207. The switchable element capacity of matrix 200 is increased to one hundred twenty-eight. While the arrangement permits scanning a sixteen by eight matrix, it requires the addition of a peripheral interface adapter. The result is an increase in the cost and complexity of the key scanning circuit.

Thus it is clear from the above that a more compact and economical solution to the problem of expanding a keyboard's capacity is needed. It is desirable that there be no increase in the number of data input or output leads or ports of microprocessors employed for scanning and that the peripheral interface adapter circuit be eliminated.

SUMMARY OF THE INVENTION

The above-stated problems of providing increased keyboard scanning capacity in microprocessor-based business machines and data terminals without increasing microprocessor input and output leads and related problems are solved by the principles of the present scanning method and apparatus. Like the prior art, the present scanning circuit comprises a microprocessor for scanning the rows and columns of a matrix of switchable elements and for reporting a code associated with a switched element to a data processor. However, the present circuit employs a parallel connection of a microprocessor output lead or leads to both the scanned matrix and to the data processor. In one embodiment of the invention, a logic gate connected in parallel to two output leads for scanning provides a strobe signal to the data processor, indicating when another parallel-connected output lead or leads for reporting the code may be read. The data processor otherwise ignores the presence of scanning signals on the parallel-connected output lead or leads. Accordingly, the scanning capacity of the microprocessor is increased without the application of a peripheral interface adapter circuit and without increasing the quantity of data input and output leads.

In particular, the present method for scanning the matrix takes advantage of the fact that the status of only one scanning lead at a time is changed during scanning. When the code of a switched element is to be transmitted to the data processor, the microprocessor causes the states of two output leads to change and ignores any data received on its retrieval port. The logic gate connected to the two output scanning leads whose states have been changed transmits a strobe signal to the data processor indicating the presence of the translated code of the switched element on the other parallel-connected output leads. The strobe signal is generated at the output of the logic gate responsive to the changed status of the two leads. Simultaneously, the translated code is made available for reading on the other parallel-connected output leads.

While the above-described apparatus and method of the present invention employ a parallel transmission of the translated code to the data processor, a serial transmission may also be accomplished in a second embodiment of the present invention. The parallel-connected output port is not required in this embodiment. The previously described lead from the logic gate provides the serial data in the following manner. During the scanning process, the output of the logic gate is in a resting mode as the state of only one input lead to the gate is changed. During serial data transmission, however, the states of both leads to the logic gate are changed simultaneously in accordance with the code to be sent and with a desired baud rate. Start and stop bits may be provided by the microprocessor at the beginning and end of the serially transmitted code word to signal the data processor.

BRIEF DESCRIPTION OF THE DRAWINGS

FIG. 7 is a partial timing diagram showing the status of the output leads of the embodiment of FIG. 4 during the reporting of a code in serial data format.

DETAILED DESCRIPTION

Figure 1:
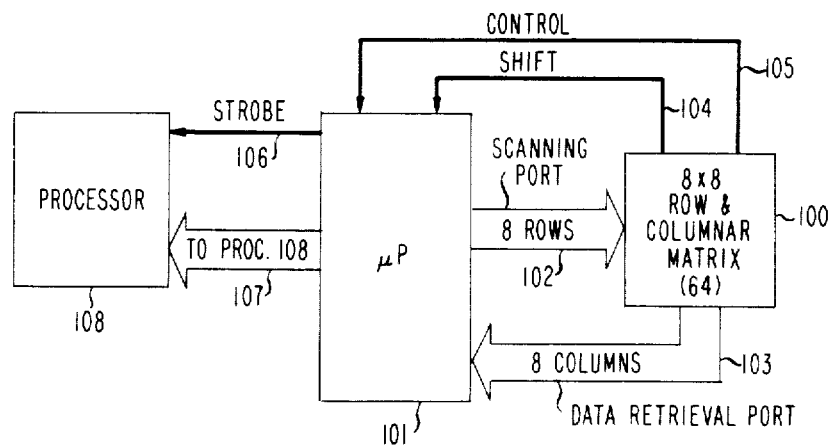
FIG. 1 is a block diagram of a prior art processing system for scanning a matrix of switchable elements.
Figure 2:
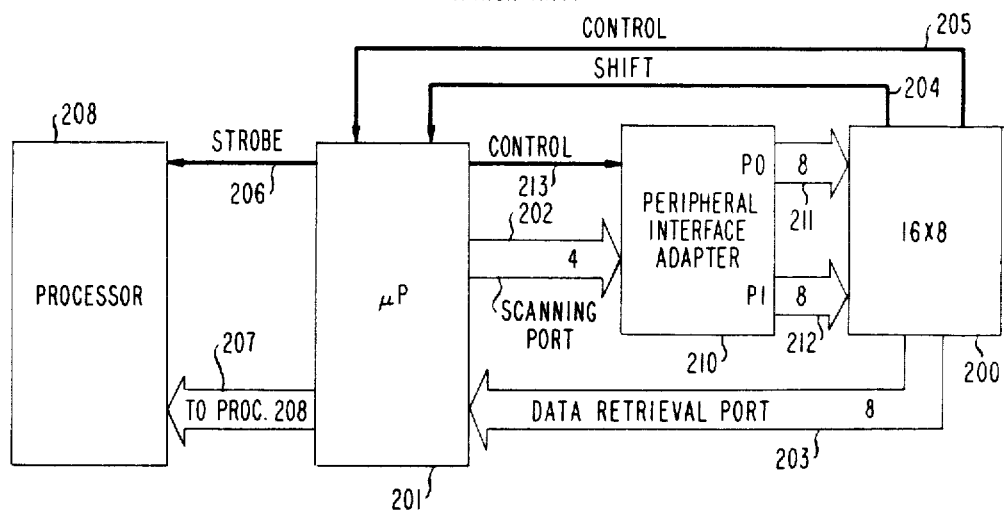
FIG. 2 is a block diagram of the prior art processing system of FIG. 1 with the addition of a prior art peripheral interface adapter circuit for increasing the scanning capacity of the processing system of FIG. 1.
Figure 3:
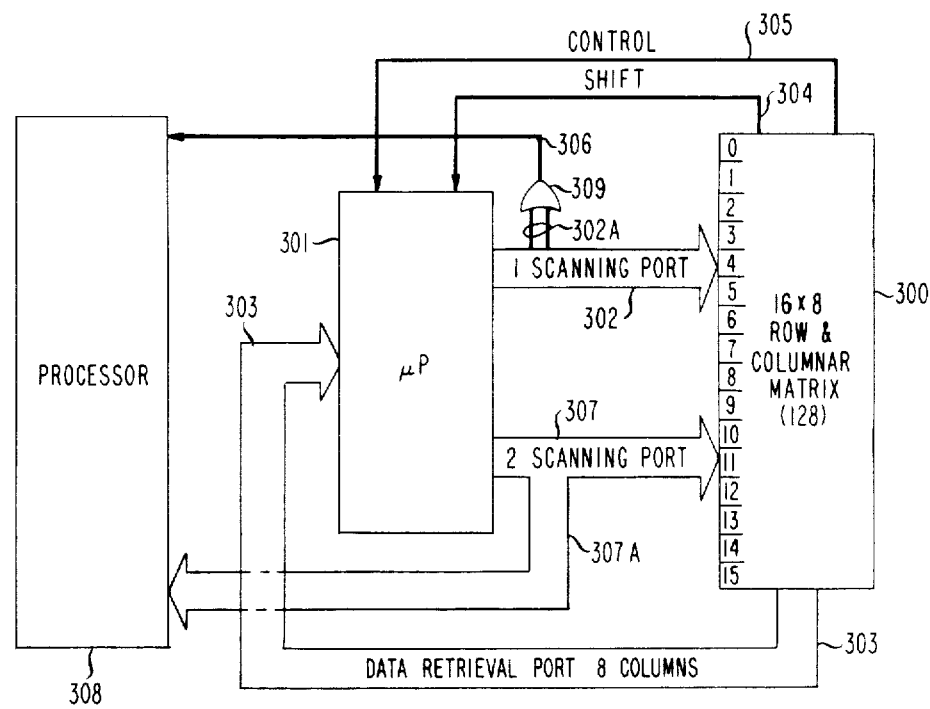
FIG. 3 is a block diagram of one embodiment of the present apparatus for scanning a matrix of switchable elements and for reporting the code associated with a switched element in parallel data format.

The first digit of each reference character employed in the detailed description indicates the figure in the drawing where the identified element first appears. Referring to FIG. 3, there is shown a block diagram of the present apparatus for scanning a crosspoint matrix 300 of switchable elements.

In particular, parallel-connected port 307A is employed for transmitting in parallel data format the code of a switched element of matrix 300 to data processor 308. Microprocessor 301 may be any microprocessor employable for the purpose of scanning. One such microprocessor which may be employed is the Intel Corp. 8748 single chip microprocessor. Such microprocessors generally provide three ports comprising eight leads each and other leads for input and output functions. In the depicted embodiment, two output ports 302 and 307 and an input port 303 each comprising eight leads are employed for scanning. In addition, other leads 304 and 305 are provided for reporting the "shift" and "control" status, respectively, of the switchable elements of the matrix 300. Microprocessor 301 also provides other leads for providing external clocking, test access and power, but the leads are not shown because their appearance is not relevant to the present invention.

Connected to two output leads 302A of output port 302 is shown logic gate 309. It is not of particular importance to which output leads logic gate 309 is connected so long as the identity of the parallel-connected leads 302A are specified in memory of microprocessor 301. Neither is it of particular importance that scanning port 302 comprise logic gate leads 302A. Leads of scanning port 307 or leads from both ports 302 and 307 may be employed so long as their identity is stored in memory.

The output of logic gate 309 is a signal on lead 306. The signal indicates to data processor 308 when data in parallel format may be read on the parallel-connected output port 307A comprising leads for reporting a code identifying a switched element of matrix 300. Accordingly, depending on the type of logic, negative or positive, employed by processor 308, logic gate 309 may be a NOR gate or an OR gate. If positive logic is employed, logic gate 309 is most appropriately an OR gate.

Scanning port 307 need not comprise code reporting leads 307A for reporting the code identifying a switched element to processor 308. In accordance with the previous discussion, the roles of ports 302 and 307 may be reversed. In further demonstration of flexibility, any output leads of a minimum quantity equivalent to the number of bits of code may be employed. The code reporting leads 307A then may be shared between scanning ports 302 and 307. Whichever output leads are employed for code reporting, however, the identification of the leads must be assigned in memory of microprocessor 301.

In the depicted embodiment, output port 307A comprises eight leads for reporting an ASCII code comprising seven bits and an eighth terminal function bit. The seven bit ASCII code corresponds to a contact closure at a row and columnar location in matrix 300 and the shift or control status of the character. The terminal function bit provides additional information not identifiable within the seven bit ASCII code.

Crosspoint matrix 300 is a matrix comprising switchable elements whose physical array may be in the format of a typewriter keyboard of sixty-four elements. Matrix 300 and microprocessor 301 conveniently may be arranged for manufacture as a unit. For example, microprocessor 301 may be sufficiently compact for mounting under the space bar of a typewriter keyboard.

The primary advantage of the present invention, however, is that a matrix of larger capacity may be scanned without increasing the number of input and output leads of microprocessor 301. The capacity achieved by the depicted embodiment is calculated by multiplying 16 rows by 8 columns or one hundred twenty-eight elements. Accordingly, a keyboard may comprise an additional sixty-four keys. If more code reporting leads are required than the eight leads an output port 307A, a ninth lead or shared leads from port 302 may be connected in parallel to data processor 308 in a similar manner to leads 302A and 307A for code reporting.

Figure 4:
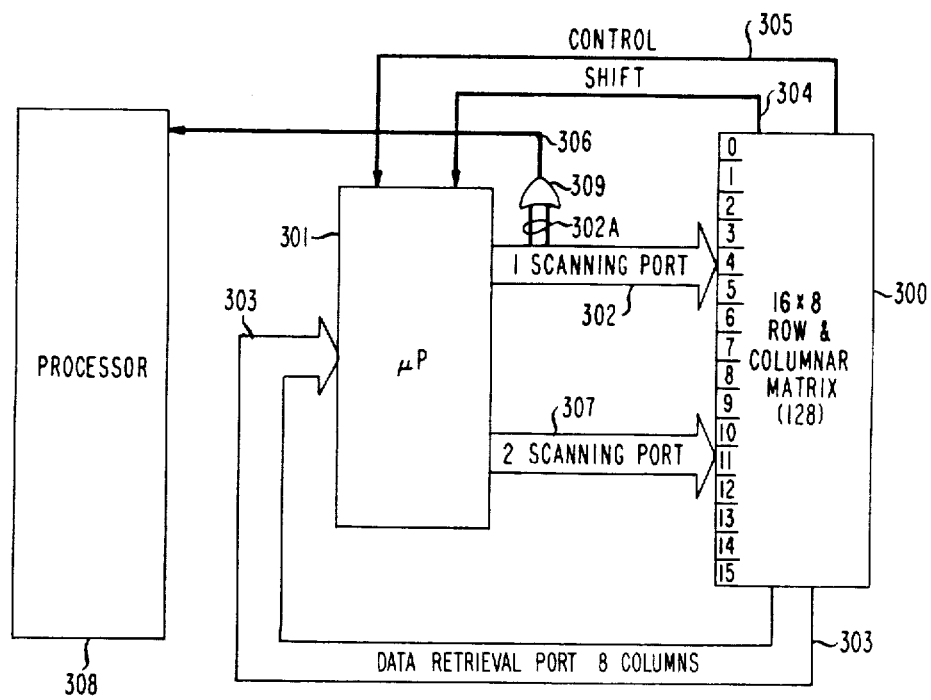
FIG. 4 is a block diagram of a second embodiment of the present apparatus for scanning a matrix of switchable elements and for reporting the code associated with a switched element in serial data format.

Referring to FIG. 4, a second embodiment of the present invention is shown which is useful for reporting the code identifying a switched element in serial data format. The serial data is transmitted over lead 306 to processor 308. The parallel connection of output leads 307A to processor 308 is not employed in the serial transmission mode and is eliminated.

In particular, the parallel-connected leads 302A at scanning port 302 are caused to change their states simultaneously in accordance with the code to be transmitted. To signal the processor 308 of an oncoming code, a start bit may be inserted preceding the code. In addition, microprocessor 301, in accordance with techniques known in the art, may provide parity and stop bits when and if required. No scanning of matrix 300 may take place during the serial transmission of data.

Figure 5:
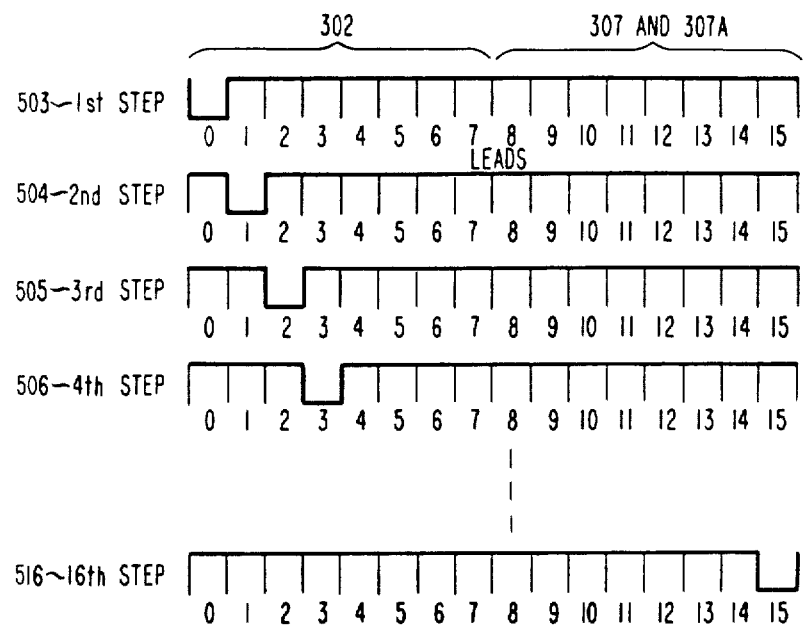
FIG. 5 is a partial timing diagram showing the status of the output leads of the embodiments of FIGS. 3 and 4 for scanning a matrix of sixteen rows.

Referring also to FIG. 5, a partial timing diagram is shown of the states of the output leads of the embodiment of FIG. 3 or FIG. 4 for scanning the matrix. Similar reference characters have been employed in FIG. 5 wherever possible to identify similar elements in the following discussion of the scanning process. Positive going logic is presumed. By convention, processor 308 operates responsive to a binary 0 on lead 306 where normally a binary 1 signal is present.

In particular, FIG. 5 shows a method of scanning matrix 300 wherein the state of one scanning lead at a time is changed. Data retrieval port 303 and control and shift leads 304 and 305 are then read to ascertain if an element of matrix 300 has switched. Accordingly, the first step 503 of the scan shows the status of sixteen output scanning leads. Leads 0–7 comprise first output port 302 for scanning matrix 300, and leads 8–15 comprise second output port 307 for scanning matrix 300. In the first step of the scan, the status of lead 0 is changed while all other leads remain constant. If no response is received over data retrieval port 303, the microprocessor 301 is assured that no columnar element associated with row 0 has switched. A binary 1 is transmitted to processor 308 over lead 306, assuring processor 308 that no parallel data is output on parallel-connected output port 307A.

Microprocessor 301 then performs the second step 504 of the scan to ascertain if any columnar elements associated with row and lead 1 have switched. The scanning process continues until all sixteen steps of the scan are completed, at which point code translation and reporting occurs. Algorithms known in the art are employed in order to ascertain if during the scanning of the rows more than one element of the matrix has switched.

In the alternative, code translation and transmission may occur as soon as a switched element is detected. Thus, after a step in the scan when a switched element is detected, the code identifying that element is transmitted.

For example, assume that between the last scanning of row 2 and the present scanning of row 2, a columnar element has switched. Then a report as to which columnar element associated with row 2 has switched is retrieved on data retrieval port 303. Scanning may continue until all the rows are scanned or the steps of code translation and code reporting may be performed immediately.

In the code translation step, the row and column of the switched element are translated into a code for transmittal to processor 308. For example, the code may comprise the ASCII code for the alphabetic character A, namely 1100001. While generally code translation is performed by microprocessor 301, it is conceivable that code translation be performed by processor 308, in which case, the row and column numbers and the control and shift lead status are transmitted to processor 308.

Figure 6:
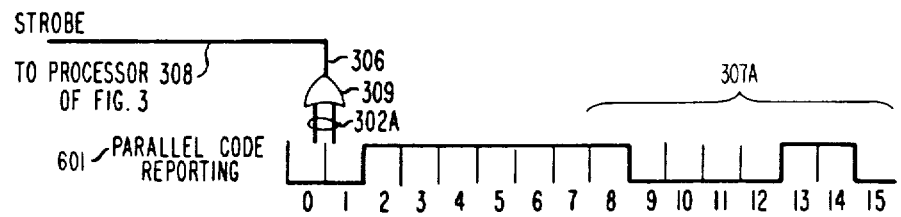
FIG. 6 is a partial timing diagram showing the status of the output leads of the embodiment of FIG. 3 during the reporting of a code in parallel data format.

In the code reporting step, the code is reported in either serial or parallel format. According to algorithms known in the art, the code of the first detected switched element is reported first. Referring to FIG. 6, the reporting of a code in parallel data format will now be explained. In parallel format, as represented by parallel code reporting step 601, leads 0 and 1 are simultaneously caused to change state. Logic gate 309 is shown having input leads 302A, comprising leads 0 and 1 from microprocessor 301, whose states have been simultaneously changed.

At the output of gate 309, a strobe signal comprising a binary 0 is provided over lead 306 to processor 308. Processor 308 then is able to recognize that output port 307, and particularly leads 307A comprising leads 8–15, contain a code of a switched element. In least significant bit first format with an additional most significant bit of zero added to signify that an ASCII character is being provided, the code of the switched element is read on leads 8 to 15 as 10000110.

Referring to FIG. 7, serial code reporting is now explained. In serial format, as represented by serial code reporting steps 701–708, the code 10000110 is serially transmitted over lead 306 by simultaneously changing the states of leads 0 and 1 in accordance with the code to be transmitted. The rate of change establishes the baud rate of serial data transmission. The baud rate is most conveniently related to the clock frequency of microprocessor 301, however, it may be a multiple or division of the clock frequency in accordance with circuitry and software known in the art.

Binary 1 is transmitted in step 701 by leaving the states of both leads 0 and 1 in a high state. Binary 0 is transmitted in step 708 by changing both leads 0 and 1 to a low state. Microprocessor 301 may precede serial code transmission by transmitting a start bit 0 or series of start bits. Additional parity may be inserted and a stop bit inserted in accordance with known data transmission techniques if desired.

After either parallel code reporting step 601 or serial code reporting steps 701–708, the microprocessor 301 resumes normal scanning. Rows 0–15 of matrix 300 are again scanned in a similar manner and the process repeated. Of course, whenever a switched element of matrix 300 is detected, either parallel code reporting 601 or serial code reporting steps 701–708 temporarily interrupt scanning as previously discussed.

While FIGS. 3, 4, 5, 6, and 7 demonstrate that code reporting is dependent upon the presence of a logic gate such as gate 309, the function of the logic gate may be assumed by a microprocessor 301 and processor 308 having memory capacity for storage of additional algorithms. A single parallel-connected output lead of a microprocessor may, under control of the microprocessor, scan a matrix at predetermined times and serially report a code at other predetermined times to data processor 308. The additional algorithms are for transmission and recognition of a unique prefix signal preceding the code of a switched element to indicate to processor 308 the presence of the code to be read.

What is claimed is:

1. A method of scanning a matrix (300) having switchable elements using a first processor (301) having ports (302, 303, and 307) comprising data input and output leads, the first processor performing the steps of:
   scanning the matrix using the output leads (302, 307);
   sensing a state change on at least one input lead resulting from a change in status of the switchable elements of the matrix;
   outputting a code indicative of the change in status of the switchable elements on at least one output lead that is connected in parallel to the matrix (300) and a second processor (308); and
   outputting a signal when the code is to be read by the second processor, which signal is output on another output lead that is connected in parallel to the matrix and the second processor.

2. Matrix scanning apparatus comprising:
   a matrix having switchable elements;
   a first processor;
   a second processor having data input and output leads, two or more of the output leads being connected in parallel to the matrix and the first processor; and means connected to selected ones of the parallel output leads and to the first processor for providing a signal to the first processor indicating when a code identifying a change in status of the switchable elements is provided to the first processor over the parallel connected leads.

3. Apparatus for scanning a matrix having switchable elements comprising a first processor (301) having ports for data input and output comprising leads, two of the leads of the first processor (301) being connected in parallel to the matrix (300) of switchable elements and to a second processor (308), the connection of the two leads to the second processor being through a single logic gate.

4. Apparatus for identifying the location of a closure in a matrix of switchable elements comprising: a processor having a plurality of leads for scanning the matrix and a plurality of leads for retrieving closure status data from the matrix, one or more selected scanning leads also providing an output identifying the location of a closure in the matrix and one or more of the selected scanning leads providing a signal indicating that the leads providing an output identifying the location of a closure are in condition to be read.

* * * * *